(12) United States Patent
Yamaguchi et al.

(10) Patent No.: US 6,875,960 B2
(45) Date of Patent: Apr. 5, 2005

(54) HEATING SYSTEM (75) Inventors: Shinji Yamaguchi, Ama-gun (JP); Yoshinobu Goto, Nagoya (JP); Hisakazu Okajima, Nishikasugai-gun (JP); Yutaka Unno, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 36 days.

(21) Appl. No.: 10/244,986

(22) Filed: Sep. 17, 2002

(65) Prior Publication Data
US 2003/0071032 A1 Apr. 17, 2003

(30) Foreign Application Priority Data

Oct. 17, 2001 (JP) ........................................ 2001-318943

(51) Int. Cl.⁷ ................................................ H05B 3/68
(52) U.S. Cl. .............................. 219/462.1; 219/444.1; 219/544
(58) Field of Search ........................... 219/444.1, 462.1, 219/483, 484, 485, 490, 543, 544, 546, 547, 548; 118/724, 725

(56) References Cited

U.S. PATENT DOCUMENTS

| 4,493,977 | A | | 1/1985 | Arai et al. | |
|---|---|---|---|---|---|
| 5,700,992 | A | * | 12/1997 | Honda et al. | ............. 219/462.1 |
| 5,927,077 | A | | 7/1999 | Hisai et al. | |
| 6,072,162 | A | * | 6/2000 | Ito et al. | ................... 219/444.1 |
| 6,133,557 | A | * | 10/2000 | Kawanabe et al. | ......... 219/544 |
| 6,207,932 | B1 | * | 3/2001 | Yoo | ........................ 219/444.1 |
| 6,423,949 | B1 | * | 7/2002 | Chen et al. | .............. 219/444.1 |
| 6,448,538 | B1 | * | 9/2002 | Miyata | .................... 219/444.1 |
| 6,469,283 | B1 | * | 10/2002 | Burkhart et al. | ............ 219/486 |
| 2002/0063120 | A1 | | 5/2002 | Yamaguchi | |

FOREIGN PATENT DOCUMENTS

| JP | 5-326112 | 12/1993 |
|---|---|---|
| JP | 2002-170655 | 6/2002 |

* cited by examiner

Primary Examiner—Sang Paik
(74) Attorney, Agent, or Firm—Burr & Brown (57) ABSTRACT

A heating system 25 has a main electric heat-generating element 3 and a heating surface 4a for heating an object, auxiliary electric heat-generating elements 5A to 5D, and a main power source 1 for supplying power to the main heating element. The system 25 further has an auxiliary power source 2 for supplying power to the auxiliary heating elements, and a power source controller for controlling the power supplied to the main heating element and to the auxiliary heating elements respectively and independently. Power supplied to the main heating element 3 is controlled by the controller within a first power range and power supplied to the auxiliary heating elements is controlled by the controller within a second power range. The second power range has a width smaller than that of the first power range so as to control temperature distribution on the heating surface 4a.

8 Claims, 7 Drawing Sheets

HEATING SYSTEM

This application claims the benefit of Japanese Patent Application P2001-318943, filed on Oct. 17, 2001, the entirety of which is incorporated by reference.

BACKGROUND OF THE INVENTION

1. Field of the Invention

The invention relates to a heating system.

2. Related Art Statement

In a system for producing semiconductors, a ceramic heater may be provided for heating a wafer (substrate) so as to deposit a semiconductor thin film on the wafer from gaseous raw materials such as silane gas by means of thermal CVD or the like. A so called 2 zone heater is known as such ceramic heater. Such 2 zone heater has a ceramic substrate and inner and outer resistance heat generators embedded within the substrate. Separate power supply terminals are connected to the respective heat generators so that electric power may be applied independently on the respective generators. The inner and outer heat generators may be thus independently controlled.

Further, in JP-A 5-326112, a resistance heat generator of a ceramic heater is constituted by plural circuit patterns each made of a high melting point metal. The circuit patterns are so arranged that they may supplement one another's defect portions. For example, one of the patterns has a defect portion such as a folded portion or a returning portion. In this case, another circuit pattern is overlapped on or over the defect portion of the one pattern.

For example, in a heater to be used for heating semiconductor wafers, the temperature of the heating surface of the heater needs to be uniformly controlled over the entire surface. It is required that the heater satisfy a severe specification, for example, that the temperature measured on the heating surface is within ±5° C., of the average of the whole heating surface under a use condition.

SUMMARY OF THE INVENTION

For example, a ceramic heater with an inner resistance heat generator is produced and an electrical power is supplied to the heat generator so that the average temperature of the heating surface reaches a desired value. It is now provided that the temperature over the heating surface is within a desired range after the average temperature reaches a desired value. Even in this case, however, the temperature distribution of the heating surface may be substantially changed after the heater is actually fixed in a chamber. Such change of the temperature distribution is depended on various conditions as follows. A fitting is used for fixing a ceramic heater on the wall of a chamber. The area and shape of the surface region of the heater contacted with the fitting may affect the temperature distribution. In addition to this, the temperature distribution may be affected by the thermal capacity of the fitting, the shape and thermal capacity of a chamber, thermal reflection and absorption on the inner wall surface of a chamber, and the pressures and gas flow inside and outside of a chamber. The contributions of these factors may be complicated and beyond any speculation.

Even when the heating surface of a ceramic heater has a desired uniformity of temperature before the heater is fixed in a chamber, the temperature distribution may be out of the desired uniformity after the heater is fixed in the chamber, according to the above reasons. It is thus necessary to control or fine tune the supply of electrical power to a resistance heat generator, after a ceramic heater is fixed in a chamber, so as to reduce the temperature distribution on the heating surface.

It has been, however, difficult to perform such control as follows. When an electric power supplied to a specific resistance heat generator element is increased or decreased, the heat generated by the generator is changed as a whole. Such change of heat from the generator may reduce or increase the temperature distribution on the heating surface after a ceramic heater is fixed in a chamber. The two-zone heater described above may be effective for changing the average temperatures of the outer and inner portions of the heating surface, respectively and independently. In such two-zone heater, however, hot spots or cold spots may be observed in only a part of the heating surface, after the two-zone ceramic heater is fixed in a chamber. The two-zone control system may not be effective for reducing such cold and hot spots observed in only a small part of the heating surface.

The inventors also considered the following system. That is, a ceramic heater is divided into many zones and separate resistance heat generators are provided each corresponding with each of the zones. The electric power to the heating elements are independently controlled. When a cold spot is observed in one of the zones of the heating surface, it seems to be effective to increase an electric power supplied to the heat generator corresponding with the zone with the cold spot observed. Such increased electric power to the zone seems to improve the heat generation so that the cold spot may be reduced or cancelled.

The inventors have actually investigated this idea and found that the control may be also ineffective for reducing the temperature distribution. The reasons would be as follows. The temperature of each zone of the heating surface is influenced by the heat generation right under the zone, as well as the heat generation by another heat generators provided right under another zones, respectively. The temperature distribution on the heating surface may be determined by many factors including the followings; heat generated from each heat generator, the shape, dimension and thermal capacity of a ceramic substrate, and the temperature, pressure and gas flow around the substrate. Such factors may affect each other. It is possible to reduce or cancel a cold spot by increasing an electric power supplied to a heat generator corresponding with the zone with the cold spot observed. In this case, however, the heat generated from the heating element right under the cold spot is transmitted to the adjacent zones, so that the total balance of heat generation and transfer in the substrate and the temperature distribution on the heating surface may be changed. Such change of balance of heat generation and transfer may generate a hot spot on the heating surface or increase the average temperature of the surface. When the average temperature of the heating surface is increased, it is necessary to reduce an electric power supplied to another heat generators provided for another zones. Such reduction of the electric power supplied to another heat generators may induce another cold spots on the heating surface. The difference of the maximum and minimum temperatures on the heating surface may be thus increased in many cases by canceling one cold spot.

An object of the present invention is to provide a novel heating system for generating heat with an electric power supplied and having a heating surface for heating an object, and to reduce the temperature distribution on the heating surface after the heating system is fixed for a specified system.

Another object of the present invention is to reduce the temperature distribution with ease and a low cost.

The present invention provides a heating system comprising a main heating element generating heat by supplying an electric power and having a heating surface for heating an object, an auxiliary heating element generating heat by supplying an electric power, a main power source for supplying the power to the main heating element, and an auxiliary power source supplying the power to the auxiliary heating element. The system further has a power source controller for controlling the power supplied to the main heating element and the power supplied to the auxiliary heating element respectively and independently. The power supplied from the main power source to the main heating element is controlled by the controller within a first power range. The power supplied from the auxiliary power source to the auxiliary heating element is controlled by the controller within a second power range. The second power range has a width smaller than that of the first power range so as to control temperature distribution on the heating surface.

According to the present invention, electric energy is supplied to the main heating element from the main power source so that the average temperature of the heating surface is controlled substantially at a target value. In addition to this, an auxiliary heating element is provided for fine tuning the temperature distribution on the heating surface after a heating system is fixed on a specified position. The inventors further considered to provide an electric power controller for controlling an electric power supplied to the auxiliary heating element. When a cold spot is observed on the heating surface, it is thereby possible to reduce or cancel the cold spot on the heating surface by increasing the electric power supplied to the auxiliary heating element corresponding with the zone with the cold spot observed.

It is noted that the function of fine-tuning of the temperature distribution on the heating surface after fixing a heating system is performed by means of an auxiliary heating element separated from a main heating element, and not by the main heating element. If it is tried to cancel a cold spot by increasing electric power supplied to the main heating element, such increase of the supplied power may substantially affect another zones. It is thereby difficult to reduce the temperature distribution on the heating surface, as described above. The reasons may be as follows. Each of the main heating elements performs a function to maintain the temperature of the corresponding zone near the target temperature, so that a substantially large electric power is needed to properly operate each main heating element.

Contrary to this, the auxiliary heating element is provided in addition to the main heating element and the electric power supplied to each of the auxiliary heating elements is independently controlled, according to the present invention. In this case, the main heating element functions to maintain the temperature of the corresponding zone of the heating surface near a target temperature, and the auxiliary heating element functions to fine tune the temperature in the zone. For realizing such division of functions, the auxiliary heating element is operated by an electric power substantially smaller than that supplied to the main heating element. It is thereby possible to minimize the thermal effects of the electric power supplied to the auxiliary heating element on another zones of the heating surface. It is thereby possible to easily perform the fine tuning of the temperature distribution on the heating surface with a relatively low cost.

According to the present invention, a power supplied from the main power source to the main heating element is controlled within a first power range, and a power supplied from the auxiliary power source to the auxiliary heating element is controlled within a second power range. The second power range is controlled to be narrower than the first power range.

The meaning will be further described. The first or second power range of electric power supplied from the main or auxiliary source to the main or auxiliary heating element means a range between an upper limit and lower limit of the electric power controllable and to be controlled. The width of the first or second power range is a difference between the upper limit and lower limit. The upper limit may be calculated as a product of a maximum rated power and a maximum of an output indication percentage. The lower limit may be calculated as a product of a maximum rated power and a minimum of an output indication percentage. The output indication percentage is 100 percent at a maximum rated power and 0 percent at a power of zero. The range of the output indication percentage may be set for each heating system actually fabricated. For example, the controllable first power range is 0 to 5 kW provided that a maximum rated power is 5 kW and a range of an output indication percentage from 0 to 100 percent. The width of the first power range is 5 kW in this case. The second power range has the same meaning as described above.

For example, the second power range is 0 to 20 W provided that the maximum of the auxiliary power source is 20 W and the range of the output indication percentage is 0 to 100 percent. The width of the second power range is 20 W in this case. The second power range for the auxiliary power source is sufficiently smaller than the first power range for the main power source. The temperature control with the auxiliary power source having a smaller power range and the control with the main power source having a wider power range are combined, so that the fine tuning of the temperature distribution may be performed with a high precision.

In the invention, the ratio of the width of the second power range to that of the first power range (width of second power range/width of first power range) may preferably not more than 40%, more preferably be not more than 30%, and most preferably be not more than 20%.

These and other objects, features and advantages of the invention will be appreciated upon reading the following description of the invention when taken in conjunction with the attached drawings, with the understanding that some modifications, variations and changes of the same could be made by the skilled person in the art.

DETAILED DESCRIPTION OF THE INVENTION

The structure or shape of the main and auxiliary heating element is not limited as far as they may be used for attaining the above object of the present invention, and includes the following cases.

(A) The main and auxiliary heating elements are separate bodies.

(B) The main and auxiliary heating elements are integrated to provide an integral body.

In the case of (A), the structure of the main or auxiliary heating element is not particularly limited.

For example, the main heating element may preferably be one of the followings.

(A1) A heater having a substrate made of an insulating material and a resistance heat generator embedded within the substrate.

(A2) A heater having a substrate made of an insulating material and heat generator adhered onto the surface of the substrate.

(A3) A heater made of a substrate composed of a resistance heat generator. Electric power is supplied to the substrate to generate heat from the substrate itself.

In the case of (A), the auxiliary heating element may preferably be one of the followings.

(A1) A heater having a substrate made of an insulating material and a resistance heat generator embedded within the substrate.

(A2) A heater having a substrate made of an insulating material and heat generator adhered onto the surface of the substrate.

(A3) A heater made of a substrate composed of a resistance heat generator. Electric power is supplied to the substrate to generate heat from the substrate itself.

(A4) A heater having sheets each made of an insulating material and a resistance heat generator interposed between the sheets.

In the case of (B), the main and auxiliary heating elements are integrated to provide an integrated heater. In this case, the followings may be presented as examples.

(B1) A resistance heat generator functioning as the main heating element and another resistance heat generator functioning as the auxiliary heating element are embedded within a substrate made of an insulating material to provide a heater.

(B2) A resistance heat generator functioning as the main heating element is embedded within a substrate made of an insulating material. The substrate has a heating surface and a back surface opposite to the heating surface. The auxiliary heating element is adhered onto the back surface of the substrate.

In the cases of A1, A2, A4, B1 and B2, the insulating material for the substrate is not particularly limited. The insulating material may preferably be a ceramic material for preventing contamination, and more preferably be alumina, aluminum nitride, silicon nitride, boron nitride (p—BN) or silicon carbide.

In the cases of A1, A2, A4, B1 and B2, the shape of the resistance heat generator is not particularly limited, and includes a wire, a foil, a mesh, a coil spring, a flat plate, a ribbon or a sheet.

In the cases of A1, A2, A3, A4, B1 and B2, the resistance heat generator may be made of a material not particularly limited, including a metal and a conductive ceramic material. The material may preferably be a pure metal selected from the group consisting of tantalum, tungsten, molybdenum, platinum, rhenium and hafnium, or an alloy of two or more metals selected from the group consisting of tantalum, tungsten, molybdenum, platinum, rhenium and hafnium. When the substrate is made of aluminum nitride, the material for the resistance heat generator may preferably be molybdenum or an alloy of molybdenum. The other known resistance heat generator such as nichrome wire or a conductive material such as carbon, TiN, TiC or the like may be used.

In the cases of A2 and B2, it is possible to form a resistance heat generator on the surface of the substrate by printing. Alternatively, a bulk composed of a resistance heating material may be joined onto the surface of the substrate. Alternatively, a resistance heat generator having a shape of wire, ribbon, strip or coil spring may be wound on the surface of the substrate.

In the case of A3, a resistance heat generator is interposed and fixed between a pair of resin sheets. Such resin sheet may be made of a resin not particularly limited as far as the resin is resistive against the maximum temperature for use in the inventive heating system. The resin may preferably be a polyimide resin or a fluorine-contained resin (particularly [Teflon] (registered trademark)).

In the case of "A", the auxiliary heating element may be fixed to the main heating element by a method not particularly limited, including the followings.

(1) The auxiliary heating element is mechanically fixed to the main heating element.

(2) The auxiliary heating element is adhered to the main heating element, by means of an adhesive not particularly limited, including a polyimide resin and fluorine-contained resin.

In a preferred embodiment, a plurality of auxiliary heating elements are positioned in the peripheral portion of a main heating element. The advantages will be described. When a heating system is fixed in a chamber, the peripheral portion of the system (particularly the peripheral portion of the main heating element) is usually fixed. The thermal transfer by conduction takes place in the peripheral portion of the heating system, so that cold spots or hot spots tend to be observed on the peripheral portion of the heating surface. It is therefore advantageous to provide the auxiliary heating elements on the peripheral portion of the main heating element for performing fine-tuning of the temperature distribution on the peripheral portion of the heating surface.

In a preferred embodiment, a plurality of the auxiliary heating elements are positioned in the peripheral portion of the main heating element and centrosymmetrically with respect to the center of the main heating element. In other words, the respective auxiliary heating elements are provided on the positions on a circle whose center is substantially identical with the center of the main heating element. Therefore, when one of the auxiliary heating elements is turned around the center of the main heating element at a specified angle, the position of the one auxiliary heating element overlaps on another position for the adjacent auxiliary heating element. The auxiliary heating elements are provided on the positions diad-symmetrical with respect to the center of the main heating element when the specified angle is 180 degree, triad-symmetrical when the specified angle is 120 degree, and quad-symmetrical when the specified angle is 90 degree.

In a preferred embodiment, the main heating element has a substrate made of a ceramic material and a resistance heat generator embedded within the substrate. The present invention is particularly effective for performing fine tuning of the temperature distribution on the heating surface of such ceramic heater.

In a preferred embodiment, the auxiliary heating element has a substrate made of an insulating material and a heat generator wound on the surface of the substrate. The insulating material may be those described above.

In a preferred embodiment, the heating system has a fixing member mechanically fixing the substrate and the auxiliary heating element so that the substrate and element are laminated with each other. The mechanical fixing member may be effective for reducing the thermal stress along the interface between the auxiliary and main heating elements and thus for preventing the fracture of the ceramic material used for the system.

In a preferred embodiment, the main and auxiliary heating elements are laminated. In a still preferred embodiment, the auxiliary heating element is provided so as to be substantially parallel with the heating surface. It is thus possible to realize uniform thermal conduction in a direction perpendicular to the heating surface in the heating system. In this embodiment, the auxiliary heating element may be provided so as to be parallel with the heating surface in a geometrically strict meaning, or may be crossed to the heating surface at an angle of not larger than 3 degrees.

An application for the heating system according to the present invention is not particularly limited, and includes a system for chemical vapor deposition, etching, baking or curing for a coater.

The embodiments of the present invention will be further described in detail, referring to the attached drawings.

Figure 1:
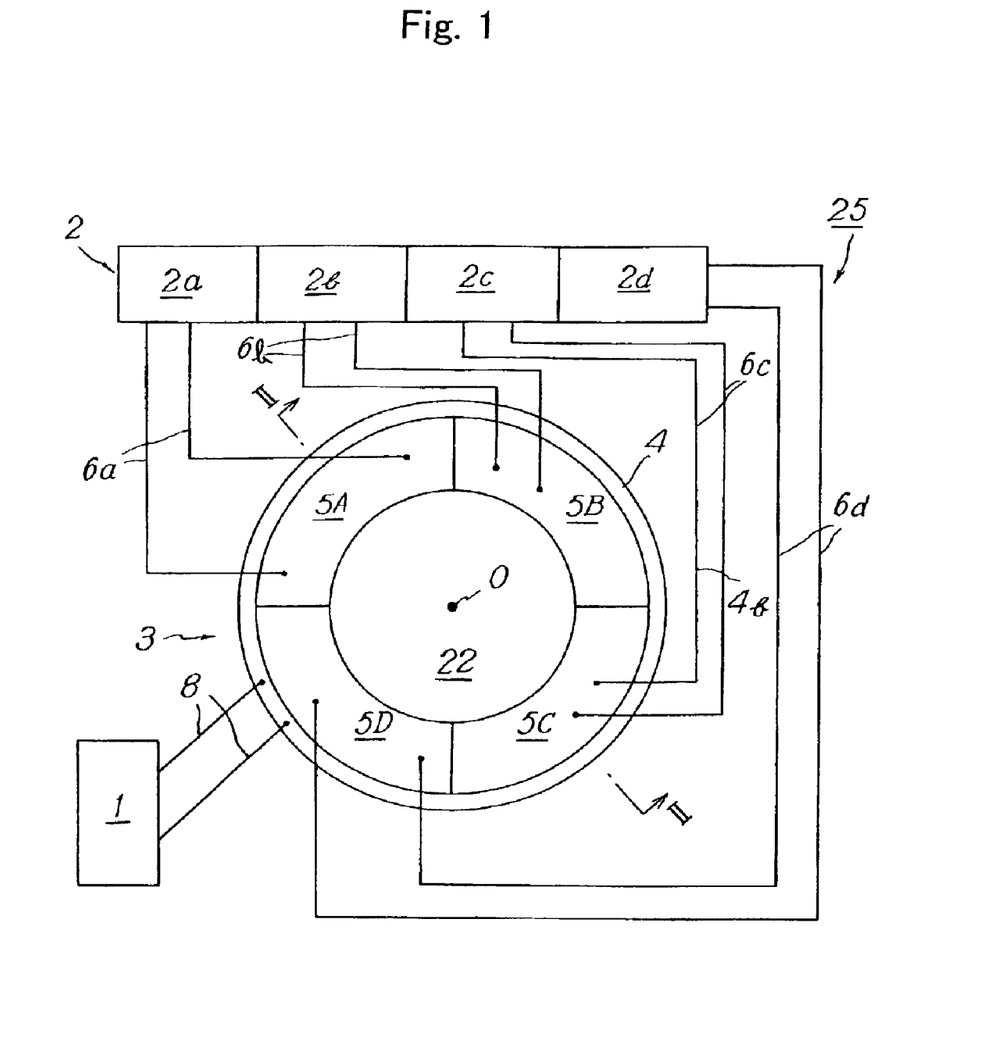
FIG. 1 is a block diagram schematically showing a heating system 25 according to the present invention, in which a main heating element 3 and auxiliary heating elements 5A to 5D are shown in a plan view.
Figure 2:
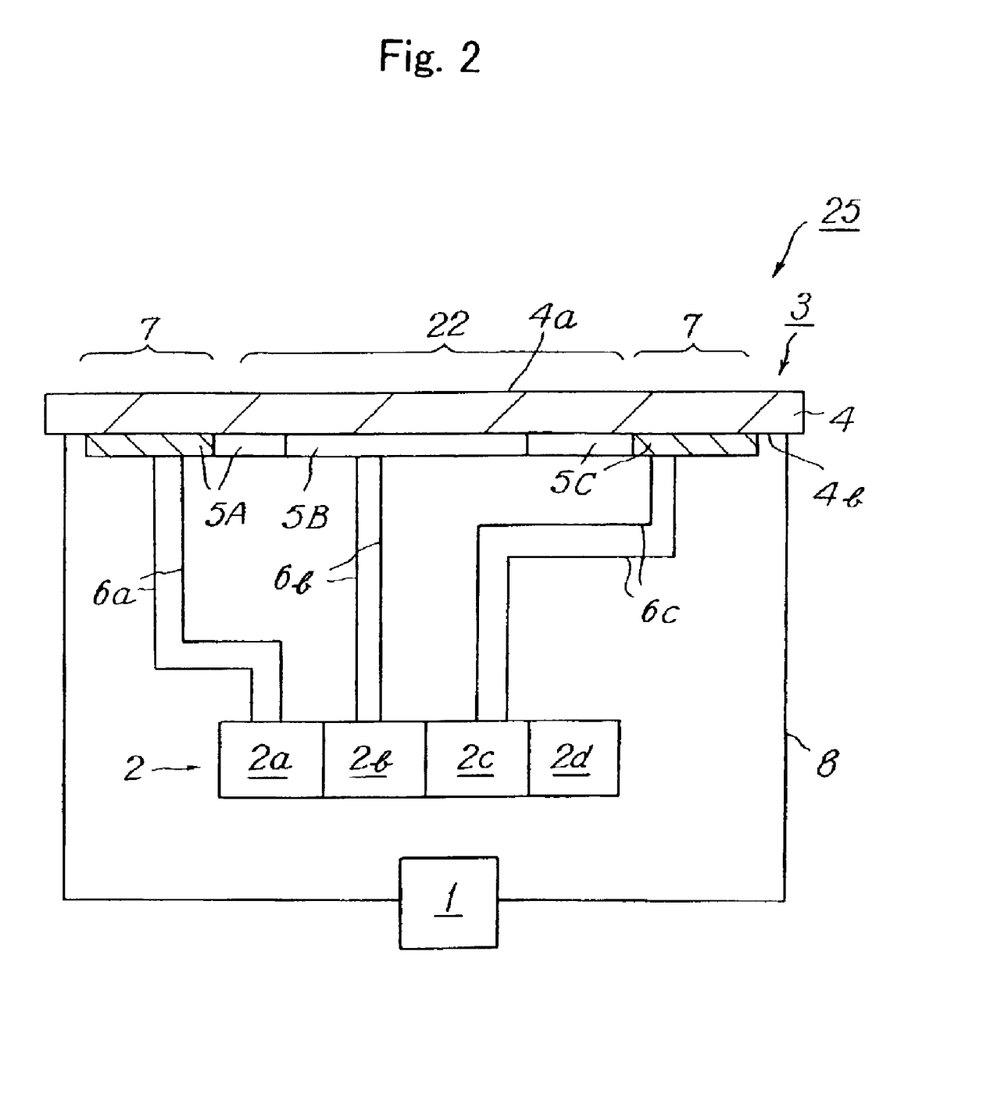
FIG. 2 is a block diagram schematically showing the heating system 25 of FIG. 1, in which the main heating element 3 and auxiliary heating elements 5A to 5D are shown in a cross sectional view.

FIG. 1 is a block diagram schematically showing a heating system 25 according to one embodiment of the present invention. In the figure, a main heating element 3 and auxiliary heating elements 5A–5D are shown in a plan view. FIG. 2 is a block diagram schematically showing the heating system of FIG. 1, in which the main and auxiliary heating elements 3, 4 and 5A–5D are shown in a cross sectional view.

In the present example, a main heating element 3 is made of a substrate 4 having a shape of a circular plate. The detail of the substrate may be variously changed and thus not shown. For example, a resistance heat generator may be embedded within the substrate 4 or may be adhered onto the surface of the substrate 4. Alternatively, the substrate 4 itself may function as a resistance heat generator. 4a is a heating surface and 4b is a back face. 7 is a peripheral portion and 22 is an inner portion of the main heating element 3. The peripheral portion 7 has a planar shape of a ring.

In the present example, the peripheral portion 7 is divided into four zones. Auxiliary heating elements 5A, 5B, 5C and 5D are provided in the zones, respectively. Each of the auxiliary heating elements is provided on the back face 4b of the main heating element 3. The four auxiliary heating elements are continuously formed circumferentially to form a ring shaped heat generator as a whole. The auxiliary heating elements are provided on positions quad-symmetrical with respect to the center "O" of the main heating element 4. That is, after each auxiliary heating element is turned around the center "O" at an angle of 90 degree, its position becomes identical with the position of the adjacent auxiliary heating element.

Terminals for the main heating element 3 are connected to a main power source 1 through cables 8. Terminals for the auxiliary heating elements are connected to a power source controller 2. In the present example, the controller 2 is divided into four controller units 2a, 2b, 2c and 2d. The auxiliary heating elements 5A, 5B, 5C and 5D are connected to the controller units 2a, 2b, 2c and 2d through cables 6a, 6b, 6c and 6d, respectively.

In the present example, the electric power supplied to the main heating element 3 is controlled with the main power source 1. The electric power supplied to each of the auxiliary heating elements is controlled with each of the controller units 2a, 2b, 2c and 2c. For example, it is provided that a cold spot is observed in a zone corresponding to the auxiliary heating element 5A after the heating system is fixed. In this case, electric power is supplied into the corresponding heating element 5A without supplying electric power to the other auxiliary heating elements 5B, 5C and 5D. It is thereby possible to securely cancel the cold spot with a small consumption of electric power and to minimize the effects of the supplied power on the other zones.

On the viewpoint of the effects of the present invention, the ratio of a total of the electric power supplied to the auxiliary heating element(s) to the electric power supplied to the main heating element (a total of electric power supplied to the auxiliary heating element(s)/electric power supplied to the main heating element) may preferably be not larger than $\frac{1}{10}$. The ratio may more preferably be not larger than $\frac{1}{20}$ and most preferably be not larger than $\frac{1}{100}$. When the heating system is to be used at a temperature not lower than 600° C., the electric power supplied to the main heating element becomes considerably large. It is thus preferred that the ratio is not larger than $\frac{1}{100}$.

The number of the auxiliary heating elements is not particularly limited. The number of the elements may preferably be not smaller than 3 and more preferably be not smaller than 4, for performing the temperature control of a part of the heating surface within a limited time delay. The number may preferably be not smaller than 4, due to the following reasons. A chamber for producing semiconductors has, in many cases, a gate valve for receiving semiconductor wafers and a window for the visual observation of the inside of the chamber. Such gate valve and window may adversely affect the balance of heat radiation, increasing the temperature distribution on the heating surface. It is possible to provide an auxiliary heating element in a first zone near the gate valve, in a second zone near the window and at least in third and fourth zones between the first and second zones. At least four auxiliary heating elements are needed for providing each element for each of the first, second, third and fourth zones. It is thus possible to select the supply of electric power so that the first zone may be heated, and/or the second zone may be heated, and/or the third zone or fourth zone may be heated. Such selection of the heat generation among the first, second, third and fourth zones may be effective for fine tuning of the temperature distribution on the heating surface, when the gate valve and window are provided in the chamber. A film may be uniformly formed on the surface of a semiconductor wafer.

A large number of the auxiliary heating elements may increase the cost of the heating system. The number of the auxiliary heating elements may preferably be not larger than 32, for reducing the cost. When each of the controller is operated on SSR system, the number may preferably be not larger than 12. Furthermore, by combining the auxiliary heating elements to perform the heat control, it is possible to realize good temperature control, even when the number is not larger than 8.

Figure 3:
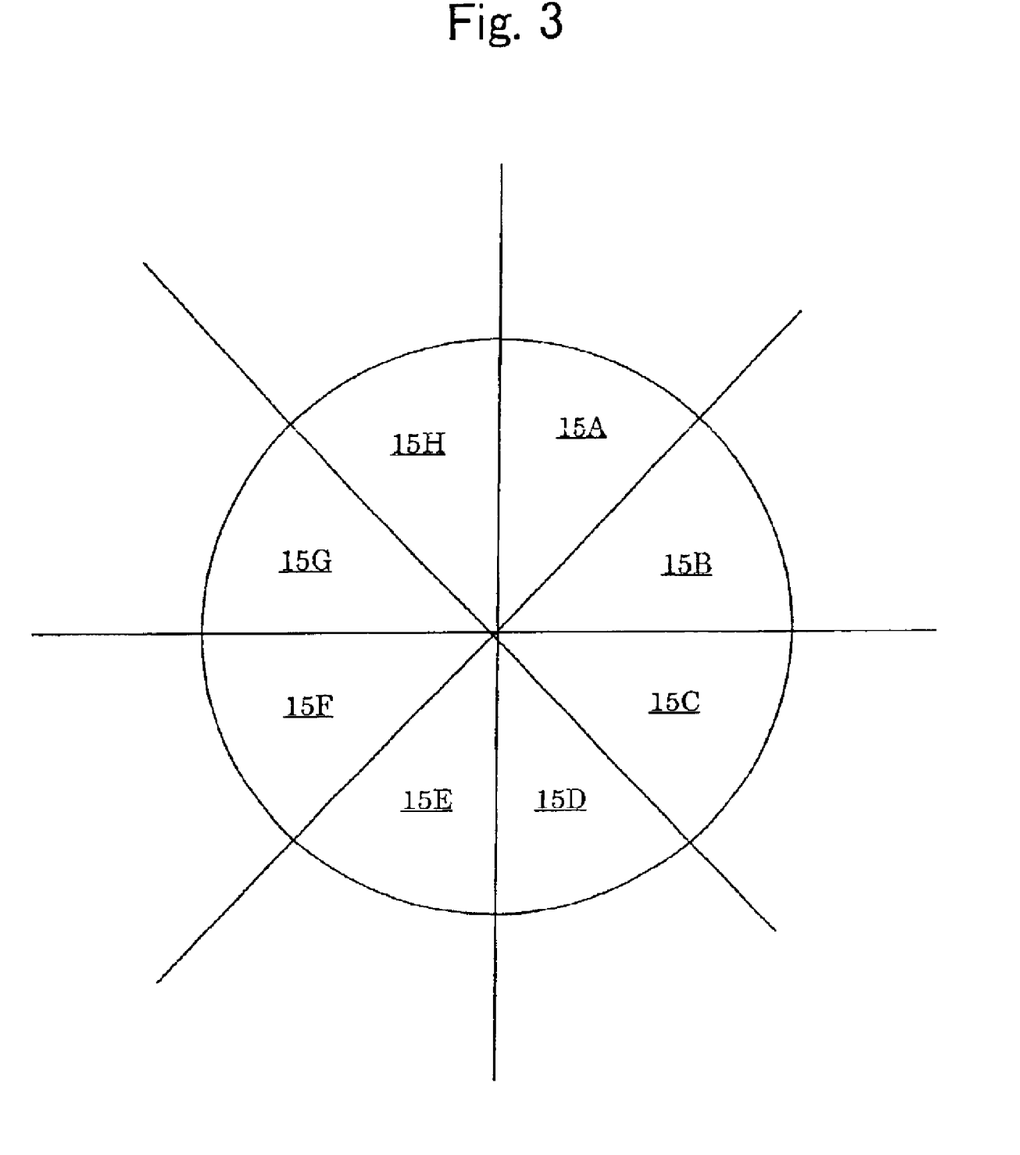
FIG. 3 is a diagram schematically showing control zones allocated for a heating surface.

For example, a plurality of the auxiliary heating elements may be provided and allocated for the corresponding heat control zones, respectively. In this case, it is possible to realize reduced temperature distribution on the heating surface as a whole, by controlling the electric power supplied to each of the auxiliary heating element for the each zone. For example as shown in FIG. 3, the substrate may be divided into 8 zones 15A to 15H. In this case, when electric power supplied to one particular zone is changed, such change may affect the temperature of the adjacent zone. When electric power supplied to one zone is changed, it is thus preferred to change electric power supplied to the adjacent zone so that at least a part of the power change in the one zone may be cancelled. For example, it is provided that the indication percentage of the auxiliary heating element for the zone 15A is 100 percent. In this case, the output indication percentage of the auxiliary heating element for the control zone 15H may be 0 percent, and the indication percentage of the auxiliary heating element for the zone 15B may be 40 percent.

Further, it is provided that the output indication percentage for the zone 15A is 100 percent. In this case, the indication percentages for the adjacent zones 15B and 14H may be 0 percent and 10 percent, respectively, and the indication percentage for the zones 15C and 15G may be 40 percent and 30 percent, respectively. When the indication percentage for the zone 15A is increased to 100 percent for canceling a cold spot in the zone 15A, the temperature of the zones 15B or 15H may become too high compared with those in the zones 15C and 15G. In this case, the output for the zones 15C and 15G (adjacent to the zones 15B, 15H) may be effectively increased for controlling the temperature distribution among the zones arranged circumferentially on the heating surface. That is, when a cold spot is observed in one zone, the indication percentage for the one zone may be increased for canceling the cold spot. In addition to this, it is possible to control the indication percentages for the two adjacent zones, and to control those for the additional zones further adjacent to the respective two adjacent zones, according to the invention. Such combination control may be effective for controlling the temperature distribution among the zones arranged circumferentially on the heating surface.

Particularly preferably, the main heating element is composed of a two-zone or three-zone heater and the number of the auxiliary heating elements is 4 to 8.

Figure 4:
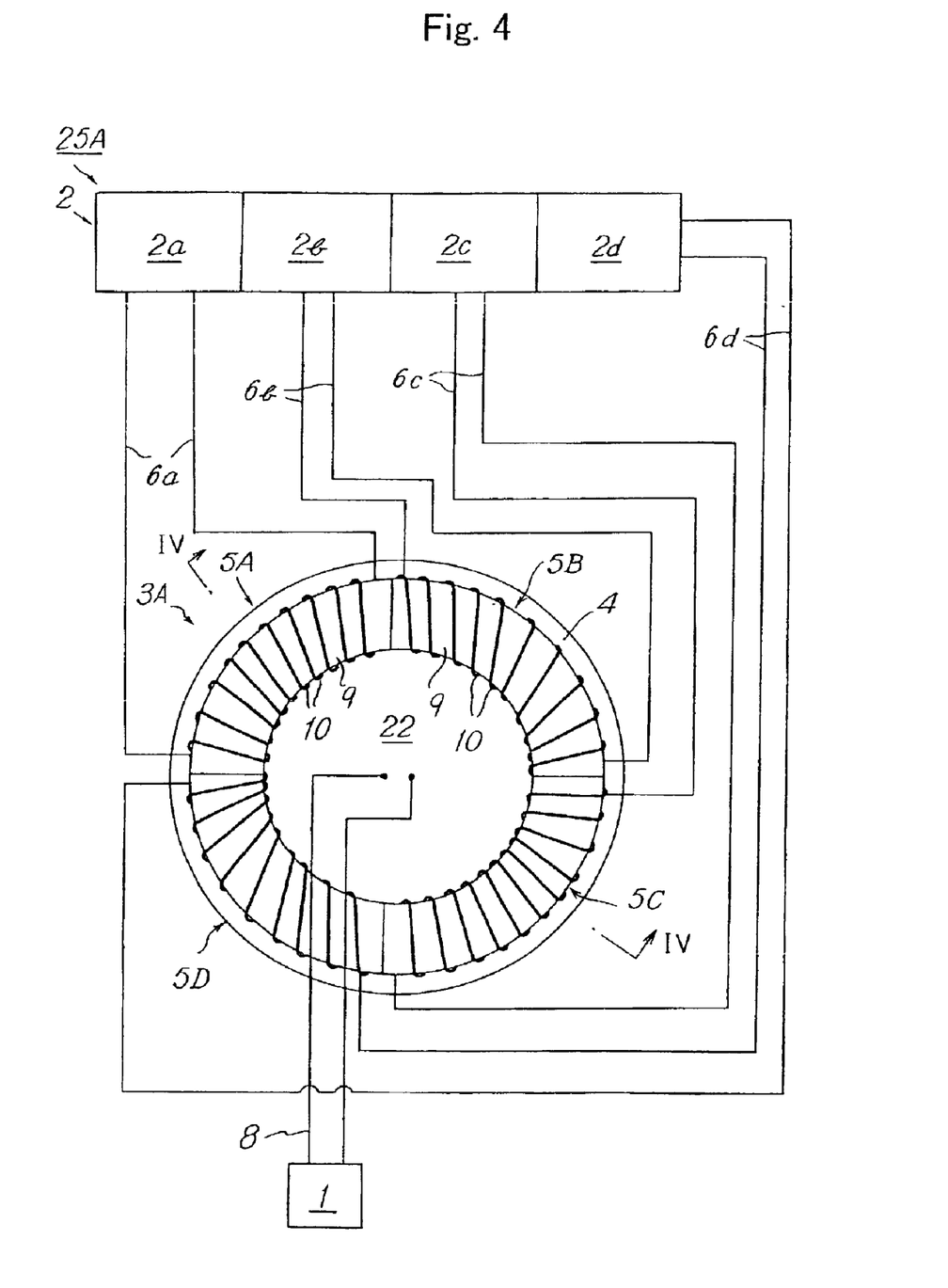
FIG. 4 is a block diagram schematically showing a heating system 25A according to another embodiment of the present invention, in which a main heating element 3A and auxiliary heating elements 5A to 5D are shown in a plan view.
Figure 5:
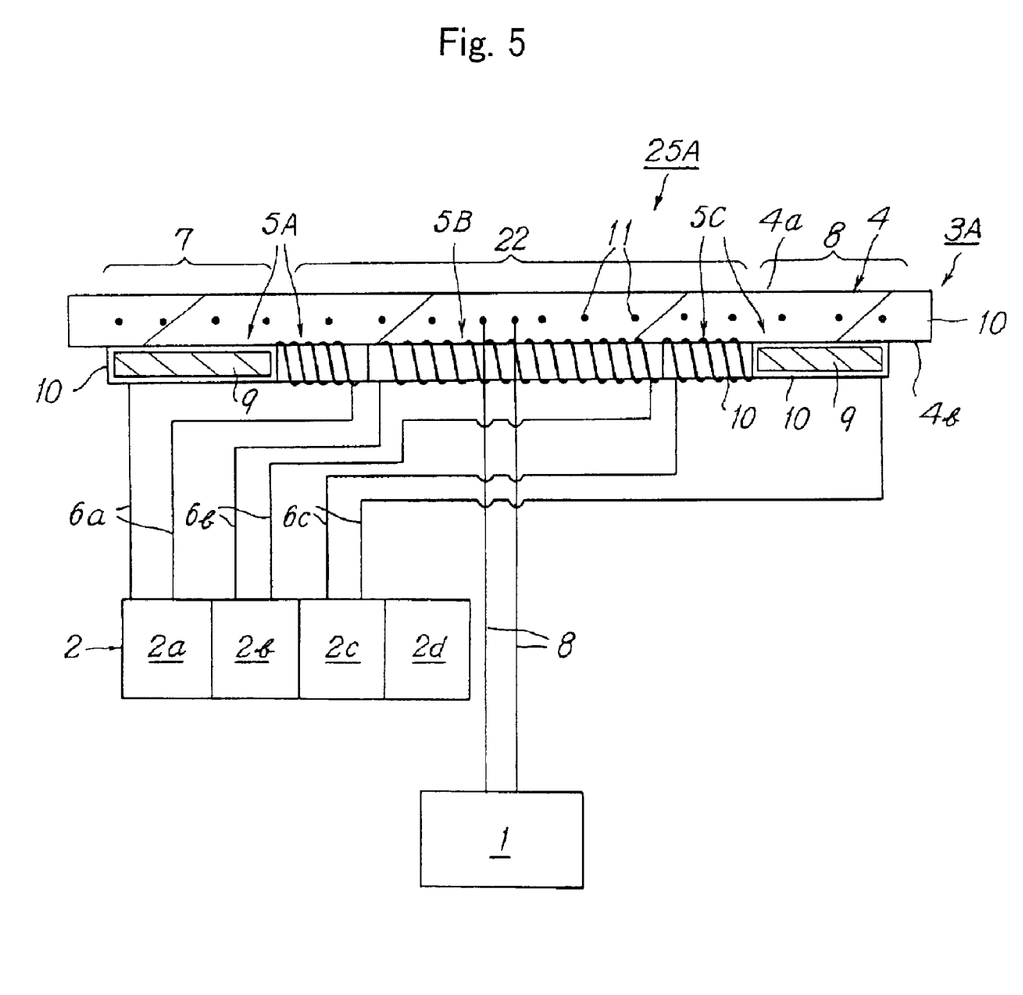
FIG. 5 is a block diagram of the heating system 25A of FIG. 4, in which the main heating element 3A and the auxiliary heating elements 5A to 5D are shown in a cross section.

FIGS. 4 and 5 relate to a heating system 25A, which is one preferred embodiment of the heating system shown in FIG. 1. FIG. 4 is a block diagram of the heating system 25A, in which a main heating element 3A and auxiliary heating elements 5A to 5D are shown in a plan view. FIG. 5 is block diagram of the heating system 25A, in which the main heating element 3A and auxiliary heating elements 5A to 5D are shown in a cross sectional view.

In the present example, the main heating element 3A has a substrate having a shape of a disk and a resistance heat generator 11 embedded within the substrate 4. The generator 11 may be a metal wire, a metal foil or a metal electrode formed by printing. A plurality of, for example four, auxiliary heating elements 5A to 5D are provided on the back surface 4b of the substrate 4.

Each of the auxiliary heating elements has a substrate 9 having a shape of an arc and a resistance heat generator 10 wound on the surface of the substrate 9. The substrate 9 is composed of the insulating material described above, and may preferably be made of mica. The resistance heat generator 10 is wound on the surface of the substrate 9, for example in a spiral form to form a kind of a coil. Both ends of the resistance heat generator 10 of the auxiliary heating element 5A are connected to a source controller 2a through cables 6a. Both ends of the resistance heat generator 10 of the auxiliary heating element 5B are connected to a source controller 2b through cables 6b. Both ends of the resistance heat generator 10 of the auxiliary heating element 5C are connected to a source controller 2c through cables 6c. Both ends of the resistance heat generator 10 of the auxiliary heating element 5D are connected to a source controller 2d through cables 6d.

Figure 6:
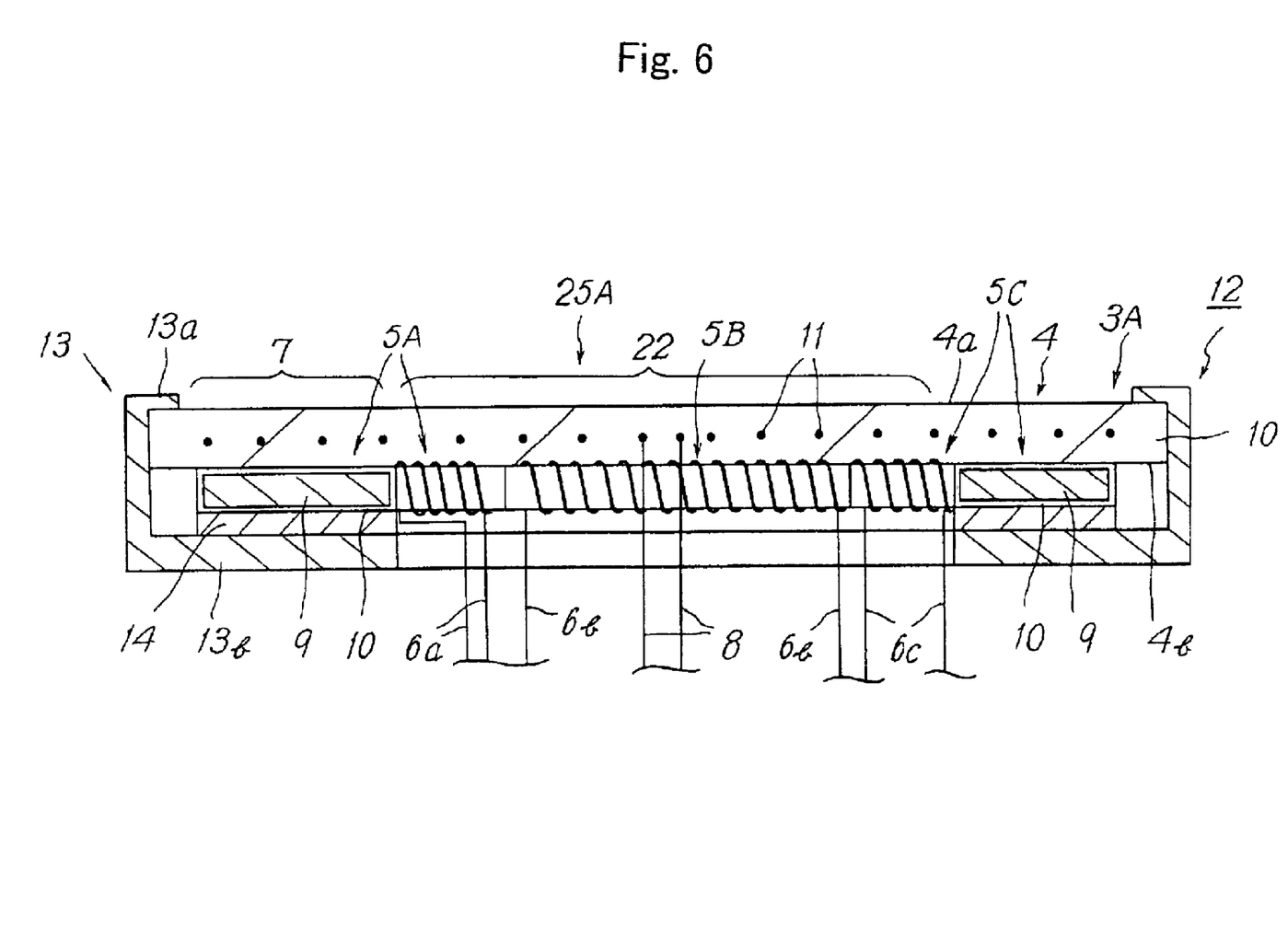
FIG. 6 is a cross sectional view showing a heating system 12 produced by fixing the heating system 25A of FIGS. 4 and 5 by means of a fixing member 13.
Figure 7:
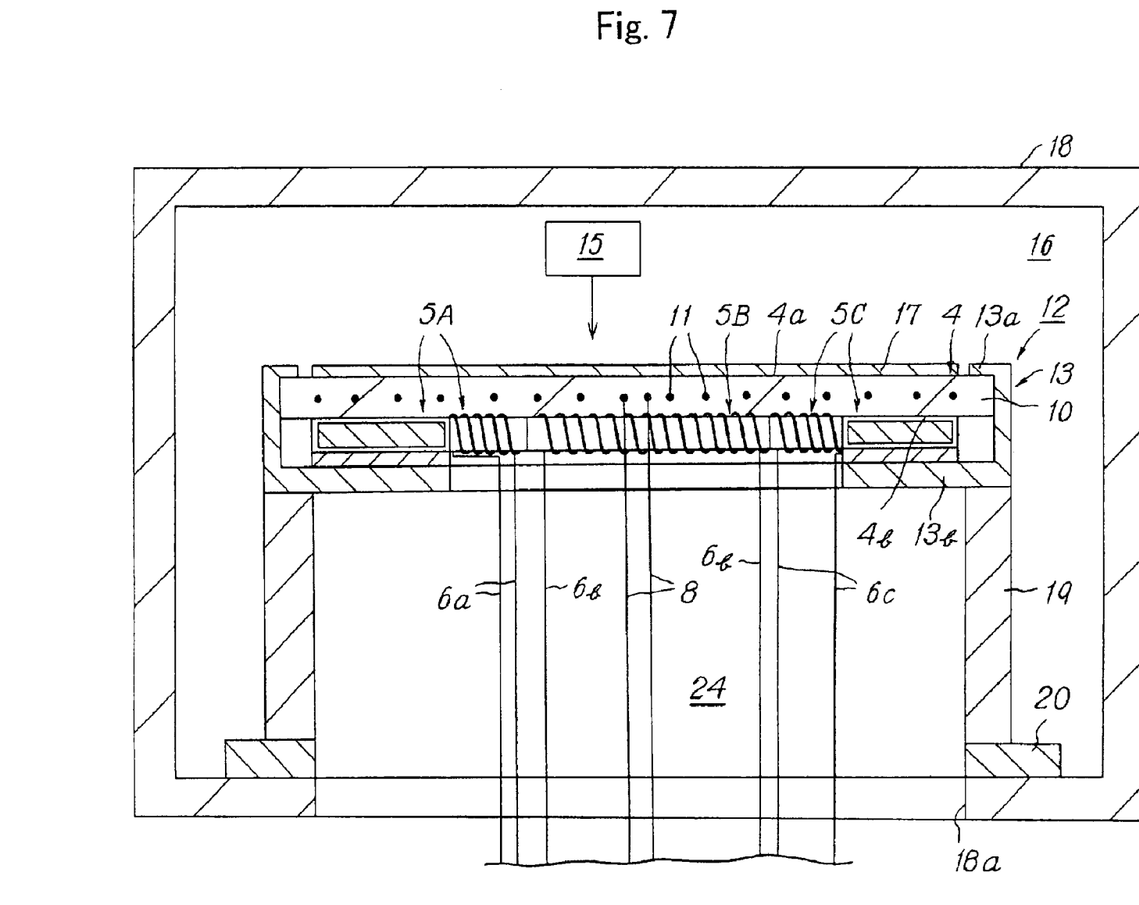
FIG. 7 is a cross sectional view schematically showing the heating system 12 of FIG. 6 fixed in a chamber 18.

In a preferred embodiment, the inventive heating system has a fixing means for mechanically fixing the substrate and auxiliary heating element so that they are laminated with each other. FIGS. 6 and 7 relate to this embodiment. FIG. 6 is a cross sectional view schematically showing a heating system 12 having the heating system 25A shown in FIGS. 4 and 5 mechanically fixed. FIG. 7 is a cross sectional view schematically showing the heating system 12 fixed in a chamber of a curing system for a coater.

As shown in FIG. 6, the heating system 12 has the heating system 25A and a fixing member 13 fixing the system 25A. In the present example, a sheet 14 made of an insulating material is provided on the back side of the auxiliary heating elements 5A to 5D. The material for the sheet 14 is not limited and may preferably be a heat-resistive resin for preventing crack formation in the ceramics. The heat resistive resin may be a polyimide resin and fluorine-contained resin.

The fixing member 13 has an upper holding portion 13a and a lower holding portion 13b. The holding portion 13a holds the edge (peripheral portion) of the heating surface 4a of the substrate 4. The holding portion 13b holds the auxiliary heating elements 5A to 5D at the back faces through the insulating sheet 14. It is possible to form the fixing member 13 with a metal when the insulating sheet 14 is interposed between the auxiliary heating element and fixing member.

As shown in FIG. 7, the heating system 12 is fixed in a chamber 18. The chamber 18 has an opening 18a formed therein. A fixing frame 19 is provided around the opening 18a through a seat 20. The heating system 12 is mounted on the fixing frame 19. After the heating system 12 is fixed in the chamber 18, the opening 18a communicates with the back space 24 of the heating system 12. Each cable passes through the space 24 and opening 18a and is connected to the main power source and power source controller provided outside of the chamber 18.

A wafer 17 coated with a coater is mounted on the heating surface 4a of the heating system 12 so that the wafer is heated at a predetermined temperature. A supply hole 15 is formed in a space 16 inside of the chamber 18. Fluid is supplied onto the surface of the wafer 17 as an arrow from the supply hole 15, while the wafer 17 is heated with the heating system 12 to cure the coating on the wafer 17. It is thereby possible to obtain desired film properties. Such film may be a resist film, an interlayer insulating film (Low-K film/for example Silk) having a dielectric constant of not higher than 3, a capacitor film (for example SBT) and so on.

According to the present invention, the power source controller controls the electric power supplied to each auxiliary heating element. The kind of the controller is not limited and includes any known power source controller, as far as it may properly function as such. It is not needed that the controller is divided into a plurality of controller units each corresponding with each of the auxiliary heating elements, as in the examples described above. The supply of electric power into each of the auxiliary heating elements may be controlled by means of on-off basis. Alternatively, the supply of the electric power into each of the auxiliary heating elements may be continuously controlled between the output indication percentages of 0 percent to a maximum percentage.

EXAMPLE

The experimental results will be described below. The heating system 12 shown in FIG. 6 was produced. The system 12 was fixed in the chamber of a curing system for a coater as shown in FIG. 7.

A ceramic heater was used as the main heating element 3A. The heater is composed of a substrate made of AlN ceramics and a resistance heat generator made of a molybdenum wire. The heating surface 4a of the heater 3A had a diameter of 320 mm. The heater 3A had a thickness of 4 mm. A thermocouple was inserted and embedded within the substrate 4.

The substrates 9 of the auxiliary heating elements 5A to 5D were made of mica. The resistance heat generators 10 were made of nichrome wires. The holding member 13 was formed of stainless steel. The insulating sheet 14 is formed of a polyimide resin. Each auxiliary heating element has an outer diameter of 300 mm, an inner diameter of 220 mm, and a thickness of 1 mm.

The thus obtained heating system 12 was fixed in the chamber 18. Electric power was supplied into the main heating element 3A so that the thermocouple indicated 200° C. The power supplied from the main power source was 342.6 watts. At this time point, the temperature distribution on the heating surface 4a was observed by means of an RTD wafer. The maximum and minimum temperatures were thus observed and the difference was 5.2° C. The temperature was relatively high in the inner portion of the heating surface and relatively low in the outer peripheral portion as a whole. The temperature in the outer peripheral portion was not uniform. About ¼ of the peripheral portion was at a relatively high temperature substantially same as that in the inner portion.

The electric power supplied from the main power source was then reduced, and electric power was supplied into the auxiliary heating elements provided in the outer peripheral portion. However, electric power was not supplied into zones having a relatively high temperature in the peripheral portion. The power supply was fine tuned until the thermocouple indicated 200° C.

At that moment, electric power supplied into the main heating element was 334.2 watts, and a total of the electric power supplied into the auxiliary heating elements was 8.5 watts. The difference between the maximum and minimum of the temperature on the heating surface was observed to obtain a value of 1.1° C.

As described above, according to the present invention, a heating system for generating heat by supplying an electric power and having a heating surface for heating an object may be provided. According to the system, the temperature distribution on the heating surface after the heating system is fixed for a specified system may be reduced with ease and a low cost.

The present invention has been explained referring to the preferred embodiments. However, the present invention is not limited to the illustrated embodiments which are given by way of examples only, and may be carried out in various modes without departing from the scope of the invention.

What is claimed is:

1. A heating system comprising:

a main heating element generating heat by supplying an electric power and having a heating surface for heating an object;

a plurality of auxiliary heating elements generating heat by supplying an electric power, said auxiliary heating elements being stacked with respect to said main heating element so as to oppose only a peripheral portion of said main heating element in the stacked direction, and also being positioned centrosymmetrically with respect to the center of said main heating element;

a main power source for supplying said electric power to said main heating element;

an auxiliary power source for supplying said electric power to said auxiliary heating elements; and a power source controller for controlling said electric power supplied to said main heating element and said electric power supplied to said auxiliary heating elements respectively and independently, wherein said electric power supplied from said main power source to said main heating element is controlled by said controller within a first power range, said electric power supplied from said auxiliary power source to said auxiliary heating elements is controlled by said controller within a second power range, and said second power range has a width smaller than that of said first power range so as to control temperature distribution on said heating surface.

2. The heating system of claim 1, wherein said main heating element has a substrate made of a ceramic material and a heat generator embedded in said substrate.

3. The heating system of claim 1, wherein said auxiliary heating elements have a plate made of an insulating material and a heat generator wound on the surface of said plate.

4. The heating system of claim 2, comprising a fixing member mechanically fixing said substrate and said auxiliary heating elements so that said substrate and said auxiliary heating elements are fixed and laminated.

5. The heating system of claim 1, wherein said auxiliary heating elements have a substrate made of a ceramic material and a heat generator embedded within said substrate.

6. The heating system of claim 1, comprising a substrate made of a ceramic material, wherein said main heating element and said auxiliary heating elements are embedded within said substrate.

7. The heating system of claim 1, wherein a ratio of the width of said second power range to that of said first power range is 40% or lower.

8. The heating system of claim 1, wherein a ratio of a total of the electric power supplied to said auxiliary heating elements to that supplied to said main heating element is 1/10 or lower.

* * * * *